Dec. 26, 1961 D. A. TASKETT 3,015,074

STABILIZED D.C. AMPLIFIER

Filed Jan. 16, 1959 2 Sheets-Sheet 1

INVENTOR.
David A. Taskett

BY Fleher & Swain

ATTORNEYS

Dec. 26, 1961 D. A. TASKETT 3,015,074

STABILIZED D.C. AMPLIFIER

Filed Jan. 16, 1959 2 Sheets-Sheet 2

INVENTOR.
David A. Taskett

BY Flehr & Swain

ATTORNEYS

United States Patent Office 3,015,074

Patented Dec. 26, 1961

3,015,074
STABILIZED D.C. AMPLIFIER

David A. Taskett, Berkeley, Calif., assignor, by mesne assignments, to Systron-Donner Corporation, Concord, Calif., a corporation of California Filed Jan. 16, 1959, Ser. No. 787,225
11 Claims. (Cl. 330—9)

This invention relates generally to operational amplifiers and more particularly to operational amplifiers for use in analog computers and in other special applications when operated with complex feedback networks.

Heretofore, certain types of operational amplifiers have utilized a differential amplifier in the input stage in order to optimize stability of the amplifier. Such amplifiers have also conventionally used chopper stabilization so that it is necessary to have a two signal input path to the differential amplifier. In order to optimize the gain in the operational amplifier, it is generally desirable to apply regeneration to the input stage of the amplifier. However, since both of the conventional input paths to the differential amplifier are in use, regeneration has not been applied to the input stage. Therefore, in the past, regeneration has only been applied to subsequent stages and as a consequence, most of the advantages of regeneration are lost. Also, heretofore, operational amplifiers of this type, which normally have several stages of gain and which are normally subjected to large amounts of negative feedback, have been very difficult to keep stable, that is, from breaking into oscillation when a large amount of negative feedback is applied. Attempts have been made to overcome this deficiency by placing a large time constant on the first amplifier so that it has a frequency response which is relatively low. This, although not completely satisfactory, in effect separates the time constant involved in the different stages of the amplifier and allows more feedback before arrival at a particular point of instability. There is therefore, a need for an operational amplifier which has optimized gain and stability.

In general, it is an object of the invention to provide an operational amplifier which has optimized gain and stability.

Another object of the invention is to provide an operational amplifier of the above character in which a differential amplifier is utilized in the first stage to optimize stability and in which regeneration is applied to the first stage of the amplifier to optimize the gain of the amplifier.

Another object of the invention is to provide an operational amplifier of the above character in which all of the stages subsequent to the differential amplifier are less susceptible to drift.

Another object of the invention is to provide an operational amplifier of the above character in which the time constant associated with the differential amplifier is enhanced.

Another object of the invention is to provide an operational amplifier of the above character in which the amount of regeneration utilized in the amplifier does not effect the bandwidth or frequency response of the amplifier.

Another object of the invention is to provide an operational amplifier of the above character in which stability can be obtained without effecting the frequency response of the amplifier.

Another object of the invention is to provide an operational amplifier of the above character in which amplification is determined exclusively by the external associated computing resistors.

Additional objects and features of the invention will appear from the preferred embodiments which have been set forth in detail in conjunction with the accompanying drawings.

Referring to the drawings.

In general, the operational amplifier of the present invention consists of several stages in which the first stage is a differential amplifier to obtain maximum stability of the operational amplifier and in which regeneration is applied to the differential amplifier to obtain maximum gain from the operational amplifier. The regeneration is applied to the differential amplifier through a resistive network connected to the cathodes of the two tubes comprising the differential amplifier.

As is well known to those skilled in the art, D.-C. amplifiers are often utilized in analog computers to perform mathematical operations of addition, subtraction, integration and multiplication by a constant. These operations are normally performed by associating precision resistors, capacitors and potentiometers with the basic D.-C. amplifier.

Figure 1:
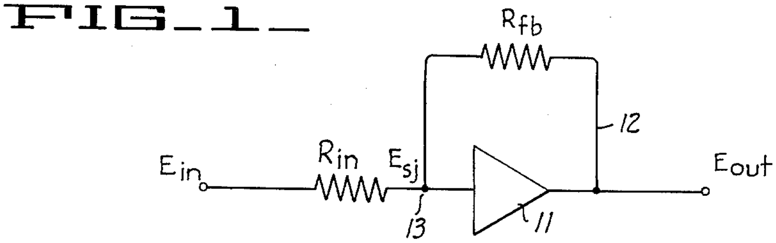
FIGURE 1 is a basic circuit of an operational amplifier.

In the block diagram in FIGURE 1, I have shown two precision resistors $R_{in}$ and $R_{fb}$ associated with an operational amplifier 11. The resistor $R_{fb}$ is a part of the feedback loop 12 connected around the amplifier. It is well known that in such an arrangement, degenerative feedback is applied around the amplifier, and the value of the closed loop gain is precisely controlled by the ratio of the feedback resistor, $R_{fb}$, to the input resistor, $R_{in}$. If the amplifier gain is large relative to this resistor ratio, then the value of the closed loop gain is exclusively determined by the resistor ratio.

The junction 13 between the input resistor and the feedback resistor is normally called the amplifier summing junction and has been labelled $E_{sj}$. The summing junction voltage $E_{sj}$ appearing at this point is equal to the amplifier output voltage reduced by the amplifier gain. As the amplifier gain is made very large, the voltage at the amplifier summing junction reduces towards zero, and the amplifier summing junction can be considered as a virtual ground. Since the D.-C. amplifier exhibits a large, but finite gain, a very small voltage exists at the amplifier summing junction. This voltage is necessary to generate the amplifier output voltage $E_{out}$.

When the voltage $E_{in}$ applied to the amplifier 11, as illustrated in FIGURE 1, is equal to zero, the output voltage would also be equal to zero. However, the amplifier tube characteristics, power supply voltages, and the resistance values do not remain perfectly stable with time. Therefore, the D.-C. potentials within the amplifier circuitry will vary as a function of tube aging, temperature, the D.-C. supply potentials, and the heater voltages applied to the amplifier vacuum tubes. These effects accumulate within the amplifier and generate an error voltage at the amplifier output terminals.

In general, the degenerative feedback which is caused by the resistive connection between the amplifier input and output terminals greatly reduces the influence of variations within the amplifier which arise in circuitry near the output terminals. The most significant source of drift within the operational amplifier 11 is associated with the amplifier input stage, and, in particular, it is caused by variations in the heater potential of the input tube. It has been shown that degenerative feedback is incapable of reducing the amplifier drift which is caused by heater current variations in the amplifier input stage.

Figure 2:
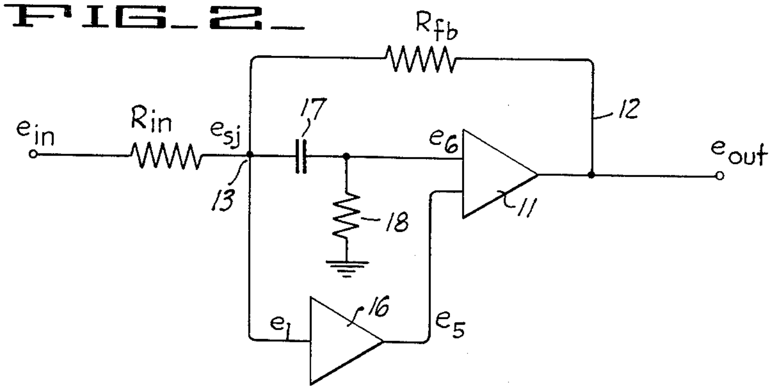
FIGURE 2 is a block diagram of a D.-C. amplifier with stabilization.

In FIGURE 2 is shown a D.-C. amplifier which is provided with stabilization. In order to minimize the low frequency components of the amplifier input stage, a drift-free stabilizing amplifier 16 is connected into the circuitry ahead of the main D.-C. amplifier 11, as shown in FIGURE 2. A capacitive-resistive coupling is provided for the D.-C. amplifier and consists of a capacitor 17 which has one end connected to the summing junction 13 and the other end connected to one side of a resistance 18 and to the input of the D.-C. amplifier 11. The other end of the resistance 18 is connected to ground as shown. The stabilizing amplifier 16 is connected between the summing junction 13 and the D.-C. amplifier 11.

In operation, there are two paths for which the signal $E_{in}$ can take through the amplifier as shown in FIGURE 2. High frequency components travel through the capacitive resistance coupling consisting of the capacitor 17 and the resistance 18 and to the D.-C. amplifier 11 to the output terminal. The gain of these high frequency signals is determined exclusively by the gain of the D.-C. amplifier. Lower frequency signals cannot pass through the aforementioned path because of the capacitor 17 and lower frequency signals which are normally associated with D.-C. drift are fed back from the D.-C. amplifier 11 through the feedback path 12 and pass through the stabilizing amplifier 16. These low frequency signals which are normally between zero and about one cycle per second pass through both the stabilizing amplifier 16 and the D.-C. amplifier 11 so that the overall gain for these frequency components is the product of the gain of the D.-C. amplifier and the stabilizing amplifier.

The stabilizing amplifier 16 is an amplifier which has a very low drift associated with it. It is placed in front of the D.-C. amplifier 11 which is normally drifty. Thus, overall amplification of the low frequency components is very high with very low drift, referred to the input. However, this low drift is associated only with the low frequency components and, therefore, the high frequency components which pass through the capactive-resistive coupling 17 and 18 still have some instability and some drift which is caused entirely by the drift in the D.-C. amplifier. Normally, these signals are from approximately two or three cycles per second up to approximately 10 to 20 kc. per second.

Therefore, to obtain from the amplifier an output which has maximum gain and maximum stability, the D.-C. amplifier 11 must have as much stability associated with it as is possible, that is, stability in the sense that the D.-C. level of the output voltage will not vary for a constant applied input voltage to the D.-C. amplifier. Also, in order to achieve maximum gain, it is desirable to increase the gain of the D.-C. amplifier 11.

The input to the amplifier as shown in FIGURE 2 has been labelled $e_{in}$, the voltage at the summing junction 13 has been labelled $e_{sj}$, the voltage applied by the capacitive-resistive coupling to the D.-C. amplifier 11 has been labelled $e_6$, the voltage applied to the stabilizing amplifier has been labelled $e_1$, the output voltage from the stabilizing amplifier has been labelled $e_5$, and the output voltage from the complete amplifier has been labelled $e_{out}$.

Figure 3:
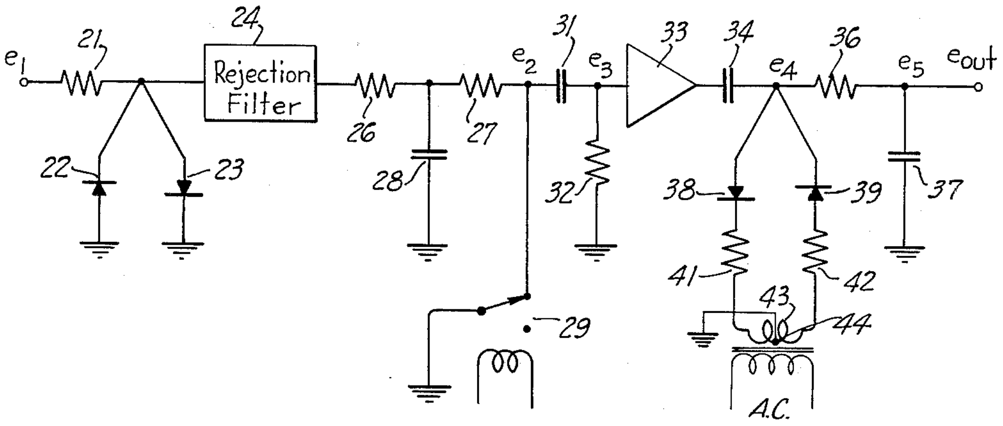
FIGURE 3 is a block diagram of the stabilizing circuit utilized in the operational amplifier.

As explained above, it is desirable to have very low drift from the stabilizing amplifier in order to achieve very low drift in the overall operational amplifier. The block diagram for the stabilizing amplifier 16 is shown in FIGURE 3. The input and the output from the stabilizing amplifier are labelled $e_1$ and $e_5$ as they are in FIGURE 2. As shown in the block diagram, the input terminal $e_1$ is connected to one side of a resistance 21.

The other side of the resistance is connected to a pair of diodes 22 and 23. The other ends of the diodes are connected to ground. The diodes are arranged so that opposite ends are connected to ground.

The resistance 21 is also connected to a 60 cycle per second rejection filter 24 of a conventional design. The output of the rejection filter 24 is connected to one side of a resistance 26. The other side of the resistance 26 is connected to one side of a resistance 27. A capacitor 28 has one side connected between the resistors 26 and 27 and the other side connected to ground as shown. The other side of the resistance 27 is connected to a terminal labelled $e_2$. Terminal $e_2$ is connected to a chopper modulator 29 of conventional design. Terminal $e_2$ is also connected to one side of a capacitor 31 and the other side of the capacitor is connected to a terminal labelled $e_3$. Terminal $e_3$ is connected to one side of a resistance 32 and the other side of the resistance 32 is connected to ground as shown. Terminal $e_3$ is also connected to the input of an A.-C. amplifier 33 of conventional design. The output of the A.-C. amplifier is connected to one side of a capacitor 34 and the other side of the capacitor 34 is connected to a terminal labelled $e_4$. Terminal $e_4$ is connected to one side of a resistance 36, and the other side of the resistance 36 is connected to a terminal $e_5$. Terminal $e_5$ is connected to one side of capacitor 37 and the other side is connected to ground as shown.

Terminal $e_4$ is connected to a pair of diodes 38 and 39 facing in opposite directions. The diodes 38 and 39 are connected to resistances 41 and 42 and are connected across a winding 43 which has a center tap 44 connected to ground as shown.

Operation of the stabilizing amplifier as shown in FIGURE 3 may now be briefly described as follows. A low frequency voltage applied to the amplifier input terminal $e_1$, passes through the filter network to the electromechanical chopper 29. The resistance 21 and the diodes 22 and 23 serve to limit the amount of voltage which is delivered to the 60 cycle rejection filter 24. When the voltage becomes considerably larger than a predetermined voltage, as for example, .4 of a volt, one of the silicon rectifiers 22 or 23 will conduct and thereby limit the voltage into the rejection filter 24 to no more than .5 of a volt. The 60 cycle rejection filter 24 is of a conventional design and consists of a single section twin T which is tuned to reject 60 cycle components in the input voltage waveforms with high attenuation.

The signal from the rejection filter 24 is fed into the low pass filter consisting of the resistance 26 and the capacitor 28. The low pass filter serves to further attenuate signals above a predetermined frequency such as 20 cycles per second.

The output from the low pass filter is applied through the resistance 27 which serves to limit the current which is applied to the chopper modulator 29 and therefore serves to prolong the life of the contacts in the chopper modulator. The silicon diodes 22 and 23 also serve to limit the amplitude of the input signal passed to the chopper stabilizer. They protect the contacts of the electromechanical chopper from damage during amplifier overload conditions, whereas otherwise the amplifier summing junction voltage would rise considerably above ground potential. The silicon diodes by limiting this junction voltage, considerably reduce the time required for the amplifier to recover from an overload condition.

Figure 6:
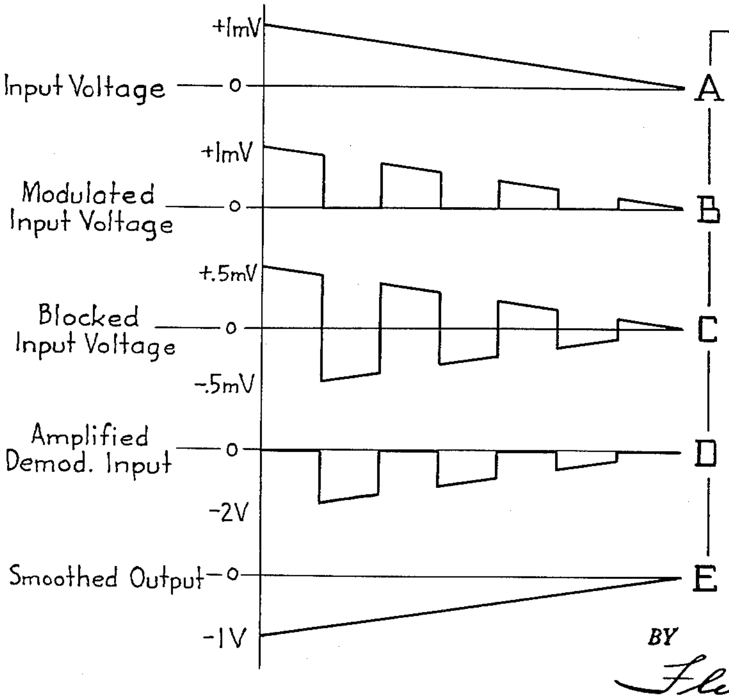
FIGURE 6, parts A, B, C, D and E, shows typical waveforms found in the stabilizing amplifier shown in FIGURE 3.

The chopper 29 alternately grounds and ungrounds the amplifier input voltage $e_2$ which is the point between the resistance 27 and the capacitor 31, at a rate of 60 cycles per second so that the low frequency components of the input voltage are converted into a 60 cycle per second wave form as shown in FIGURE 6B. The input voltage to the stabilizing amplifier is shown in FIGURE 6A. In effect, the signal is modulated at a rate of 60 cycles per second and is capacitively coupled into the A.-C. amplifier 33 by the capacitor 31. The blocking capacitor 31 removes the D.-C. component of the signal and produces a waveform as shown in FIGURE 6C.

The A.-C. amplifier 33 is of a conventional type such as a two stage capacitively coupled amplifier exhibiting a suitable mid frequency gain such as 4000. The output of this amplifier is an amplified square wave voltage in phase with the signal applied to the input to the amplifier. This signal is passed through the blocking capacitor 34 to the diode demodulating circuit consisting of the rectifiers 38 and 39. The entire circuitry between the terminals $e_2$ and $e_4$ acts like a D.-C. amplifier, but does not exhibit any drift by virtue of the fact that the circuitry is capacitively coupled, that is although the A.-C. amplifier can drift and the parameters can change, the capacitive coupling eliminates any long term or low frequency drift.

The diode modulator operates in synchronism with the chopper modulator 29, in order to generate a rectified voltage, which is then applied to the D.-C. amplifier 11, through the RC filtering network formed by the resistance 36 and the capacitor 37.

The diode modulator operates as follows: The two silicon diodes 38 and 39 are connected in series with current limiting resistors 41 and 42 across a suitable center tapped low voltage A.-C. source such as 6.3 volts 60 cycle A.-C. During one half of the 60 cycle per second period, the two diodes will conduct heavily, causing voltage at the junction $e_4$ to be at the same level as the center tap 44 of the filament power source 43; i.e., at zero potential. During the second half of the 60 cycle per second period, the two silicon diodes will be biased in the non-conducting state and the voltage at the junction between these diodes will be unaffected by the demodulator circuitry. The waveform of the voltage at the junction $e_4$ between the diodes is shown in FIGURE 6D. The wave form of the voltage at the output terminal $e_5$ is shown in FIGURE 6E. It will be noted that the waveform has been smoothed by the action of the smoothing filter consisting of the resistor 36 and the capacitor 37.

By way of example, one stabilizing amplifier constructed in accordance with the above had the following components:

| | |
|---|---|
| R21 | 10K |
| R26 | 120K |
| R27 | 270K |
| R36 | 10M |
| R41 | 1K |
| R42 | 1K |
| C104 | .05 $\mu$f. |
| C105 | .02 $\mu$f. |
| C34 | .02 $\mu$f. |
| C37 | 2 $\mu$f. |
| Diodes 22 and 23 | IN138A |
| Diodes 38 and 39 | IN138A |

An amplifier constructed with these components was found to have a gain of 1000 at zero frequency (D.-C.). The low pass RC filter consisting of the resistance 26 and the capacitor 28 attenuated input signal frequencies above 0.1 cycle per second, and the stabilizing amplifier was virtually removed from the circuit at frequencies substantially above 5 cycles per second.

The stabilizing amplifier, therefore, is the normal path for D.-C. and drift frequency components, while amplifier input signals of frequencies above approximately one cycle per second are shunted across the stabilizing amplifier directly to the D.-C. amplifier 11 by means of the capacitive coupling network consisting of the capacitor 17 and the resistance 18 as hereinbefore described. By way of example, one embodiment of the present invention had a coupling network in which the capacitor 17 had a value of .1 $\mu$f. and the resistance 18 had a value of 10m.

Figure 4:
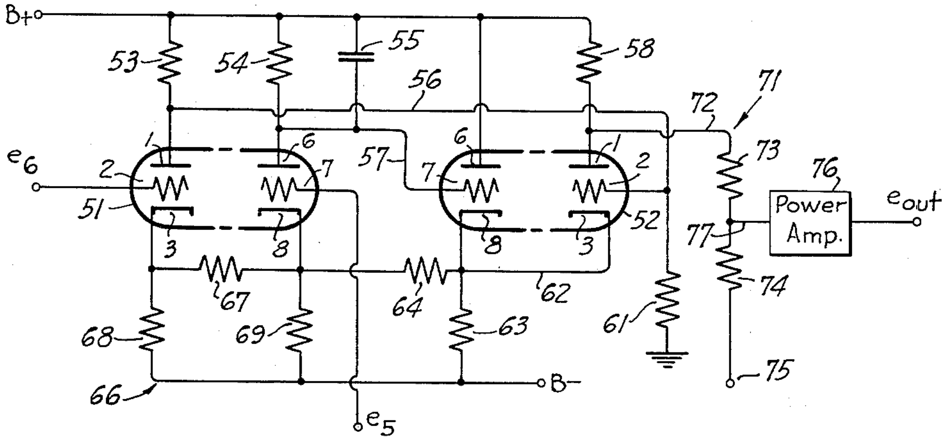
FIGURE 4 is a circuit diagram of the D.-C. amplifier incorporating the present invention.

The circuit diagram for the D.-C. amplifier 11 is shown in FIGURE 4. The D.-C. amplifier consists of a pair of dual triodes 51 and 52, each of which has a pair of plate elements 1 and 6, a pair of grid elements 2 and 7, and a pair of cathode elements 3 and 8. If desired, each of the triodes of the dual triodes may be separate tubes.

The input terminal $e_6$ to the D.-C. amplifier is connected to the grid element 2 of tube 51. The input terminal $e_5$ to the D.-C. amplifier is connected to the grid element 7 of the tube 51. Plates 1 and 6 are connected to a B+ supply through plate load resistors 53 and 54. Plate 1 of tube 51 is connected to the grid 2 of tube 52 and plate 6 of tube 51 is connected to the grid 7 of tube 52 by conductors 56 and 57 respectively. Plate 1 of tube 52 is connected to the B+ supply by a plate load resistor 58 and the plate 6 of tube 52 is directly connected to the B+ supply. The grid element 2 of tube 52 is connected to ground through a resistor 61. The cathode element 3 of tube 52 is connected to the cathode element 8 of tube 52 by a conductor 62. The cathode element 8 of the tube 52 is connected through a cathode load resistor 63 to the B− terminal of the power supply. Cathode element 8 of tube 52 is connected through a resistance 64 to a pi impedance network 66 consisting of an isolating and coupling resistor 67, and plate to cathode current limiting resistors 68 and 69. The resistance 67 is connected between the cathode elements 3 and 8 of tube 51. The resistance 69 is connected between the cathode element 8 of tube 51 and the B− terminal of the power supply and the resistance 68 is connected between the cathode element 3 of tube 51 and the B− terminal of the power supply.

Plate 1 of tube 52 is connected to a voltage dividing network 71 by a conductor 72. The voltage dividing network consists of serially connected resistances 73 and 74. The resistance 74 is connected to negative terminal 75 of the power supply.

The input to the power amplifier 76 is connected to a point between the resistances 73 and 74 by a conductor 77. The output from the amplifier 76 is designated as $e_{out}$. The amplifier 76 is of conventional design and will not be described in detail. In general, the output power amplifier makes use of a constant current triode in the plate circuit of the pentode section of a suitable tube such as that designated by type No. 6BR8.

The D.-C. amplifier may now be described briefly as follows. In general, the two dual triodes 51 and 52 are direct coupled differential amplifiers having a regenerative feedback path through the resistor 64, connected between their cathodes. This regenerative feedback path greatly increases the gain of tube 51 and helps to reduce drift at the output terminals caused by variations in subsequent circuitry.

In operation, the input signal $e_6$ is amplified by the left triode half of the tube 51 and the signal is developed across its plate load resistor 53, in a conventional manner. The signal $e_5$ is supplied to the right half of the tube 51 and the input signal is developed across its plate load resistor 54. The common cathode coupling provided by the resistance 67 transfers the cathode signal of the left half of tube 51 caused by the input signal $e_6$ to the cathode of the right half of the differential amplifier. As a consequence, since $e_5$ is applied to the grid 7 and $e_6$ is applied to the grid element 2, a voltage proportional to $e_6$ is created at the cathode element 3 and transferred over to the cathode element 8. Therefore, the signal which is developed in the plate load resistor 54 is proportional to the grid to cathode voltage or $e_6$ minus $e_5$. As a consequence, the signal which is delivered to the grid element 7 of tube 52 is voltage $e_5$ minus $e_6$ amplified.

The same relationship exists with respect to the left hand side of the tube 51. Signal $e_5$ which is delivered to the grid element 7 is transferred to the cathode element 3 of tube 51 through the resistance 67 and, therefore, as a consequence, the signal developed across the plate load resistance 53 is proportional to the grid to cathode voltage of $e_5$ minus $e_6$.

It is, therefore, apparent that the tube 51 acts as a differential amplifier which generates a plate voltage which is proportional to the difference of the two applied voltages. These amplified signals available on plate elements 1 and 6 of tube 51 are directly coupled to the grids of the tube 52. Tube 52 also acts as a differential amplifier. Therefore, the signal which appears on grid element 7 of tube 52 is directly coupled to the cathode element 3 of tube 52 and in effect is subtracted from the signal on the grid element 2 of tube 52. Therefore, the amplitude of the signal which is delivered across the plate load resistance 58 is amplified and is proportional to the voltage difference between the signals on grid and cathode elements 2 and 3 of tube 52. The resultant signal which is available on plate 1 of tube 52 is thus greatly amplified and proportional to $e_6$ minus $e_5$.

As is well known to those skilled in the art, differential amplifiers are utilized to inherently improve the stability of the circuitry with regard to changes in filament voltage applied to both of the tubes 51 and 52.

The left half of tube 52 acts as a cathode follower which takes a signal on its grid from the high impedance source consisting of the plate 6 of the tube 51, and transforms it into a signal of lower impedance on its cathode element 8 which is directly coupled to the cathode 3 of tube 51. This makes for more perfect subtraction between the signals appearing on the grid and cathode elements 2 and 3 of tube 52. This is made possible by having a low impedance source from the cathode follower.

In effect, the left hand side of tube 51 is also made nearly a cathode follower; that is, the plate load resistor 53 is made relatively small in comparison to the plate load resistor 54. The resistance 61 connected to the grid element 2 of tube 52 serves to ensure that the average D.-C. level on plate 1 of tube 51 is similar to or almost identical to that on plate element 6 of tube 51. By having similar voltage levels on the plates of the differential amplifier, better subtraction of the applied signals is achieved. Resistance 61, therefore, in effect, forms a voltage divider supplying the operating voltage for plate element 1 of tube 51 by reducing the voltage which is applied to the plate 1 so that it is equal to that on plate 6 of tube 51.

The voltage which is available across the plate load resistor 58 is greatly amplified and is proportional to the difference between the applied signals $e_6$ and $e_5$. It is, therefore, necessary to deliver this signal at the proper level to the power amplifier 76, as for example, a −200 volts. The signal is resistively coupled down to this level by the voltage divider network consisting of the resistors 73 and 74 which are connected to a suitable negative voltage 75 such as a −416 volts. The signal is then amplified greatly by the power amplifier and the output voltage of the entire amplifier is available at the $e_{out}$ terminal.

As explained previously, it is highly desirable to have as much gain as possible in the D.-C. amplifier in order to achieve accurate closed-loop amplification, that is, amplification which is determined exclusively by the external computing resistors as hereinbefore explained. The differential amplifier which has excellent stability normally exhibits relatively low gain. In order to enhance the gain of the differential amplifier, regeneration must be applied around it. This, however, is made difficult because of the fact that a chopper stabilizing amplifier has been used which requires two signal input paths to the differential amplifier utilizing both of the grids as shown by the signals $e_5$ and $e_6$ connected to the grid elements 7 and 2 of the tube 51. This difficulty has been overcome by providing a feedback path through the resistor 64 which couples the cathode elements of the differential amplifiers. However, in order to apply regeneration to the differential amplifier, it is necessary to influence one half of the tube more than the other half of the tube. In the circuitry shown, this is accomplished by the isolating resistor 67. The signal which is to be applied regeneratively to the differential amplifier is conductively coupled from the cathode follower comprising the left half of the tube 52 to the cathode element 8 of tube 51 by way of the resistive divider network consisting of the input impedance to the cathode element 8 of tube 51 and the series impedance 64.

If a positive signal $e_5$ is applied to the grid element 7 of tube 51, the negative (180° out of phase) amplified signal exists at plate element 6 of tube 51 and is transferred to the grid element 7 of tube 52. The cathode follower action of this left hand section of the tube provides a negative signal at element 8 of tube 52 which is almost equal in amplitude to that which is available on the grid element 7 of tube 52. This signal is then conductively coupled through resistance 64 to the cathode element 8 of tube 51 as a negative signal which is opposite in polarity to the signal $e_5$ originally applied to grid element 7 of tube 51. As a consequence, the signal developed on the plate element 6 of tube 51 is proportional to the difference between the voltage on grid element 7 and cathode element 8, and for that reason, amplification of the differential amplifier is enhanced substantially. In this manner, regeneration and all of its advantages are obtained in a differential amplifier in which the grids of the differential amplifier are utilized for other input signals.

The amount of gain provided by the regenerative feedback path is controlled by the size of the resistor 64. To establish this fact, let it be assumed that A is equal to the gain normally obtained from the right hand side of the tube 51 between grid element 7 and plate element 6, and the gain through the cathode follower from its grid element 7 to its cathode element 8 of tube 58 and that $\beta$ is equal to the loss which is realized in transferring the voltage from the cathode element 8 of the cathode follower to cathode element 8 of tube 51. The product of $A\beta$ is therefore the loop gain. The value of $\beta$ is primarily controlled by the resistor divider hereinbefore mentioned consisting of the resistor 64 considering it as the top resistor, and the equivalent impedance looking into the cathode element 8 of tube 51, considering it to be the bottom resistor. In effect, $\beta$ will, therefore, equal the equivalent impedance over the equivalent impedance plus the resistance of resistor 64.

If, then, the product of $A\beta$ is made very nearly equal to one, the regenerative gain from the grid element 7 of the differential amplifier through the plate element 1 of tube 52 can be enhanced very greatly. If the product of $A\beta$ is made precisely equal to one, infinite gain can be realized through this path. As a consequence, the amount of regeneration or the amount of gain enhancement is controlled by the size of the resistor 64 relative to the impedance represented in the cathode element 8 of tube 51.

In addition to enhancing gain, the relationship between $A\beta$ also artificially enhances the time constant which is associated with the product of the capacitor 55 and resistance 54 in the plate circuit of plate 6 of tube 51. Normally, without regenerative feedback, this time constant will determine the upper frequency roll-off point, that is, it will determine the band width of the amplifier. Thus by placing the resistor 64 in the circuit and adjusting it for a certain value of $\beta$, this time constant will be enhanced or enlarged by the same amount as the gain through the circuit. This has a distinct advantage when several stages are cascaded and negative feedback is applied around the entire amplifier. By regenerating or enhancing the time constant in the first stage, subsequent time constants can be made relatively smaller. This greatly improves the stability of the operational amplifier against oscillation.

Resistor 64 normally need not be adjustable. By way of example, in one embodiment of the present invention, the resistor was chosen so that it would yield gain of $\beta$ of $\frac{1}{50}$ with a normal gain of approximately 50 through tube 51. As a consequence, the product of $A\beta$ is one making possible a regenerative gain of infinity. However, the resistors which comprise the shunt impedance from the cathode element 8 to ground have normally a 5% tolerance and the cathode impedance looking into the cathode element 8 of tube 51 has a tolerance of approximately plus or minus 25%. Therefore, the gain through tube 51 is constant to within about 25%. The resistors which define the value of $\beta$ have a tolerance of from 10 to 20%. Thus, $\beta$ has a value of approximately .02 plus or minus 30% and, therefore, the gain is approximately 50 plus or minus 10 to 20%. This yields a gain enhancement in the neighborhood of 5 to infinity. For the above tolerances, the minimum gain would be 5 and actually infinite gain may be achieved. However, even with a minimum gain of 5, a substantial improvement in amplifier operation is provided with respect to stability of the amplifier with regard to oscillation and with regard to changes in voltages following the differential amplifier circuitry of tube 51.

In the above embodiment, the following components were utilized.

| | | |
|---|---|---|
| Tubes **51** and **52** | | 12AX7 |
| Resistance **53** | | 120K |
| Resistance **54** | | 2.2m |
| Resistance **58** | | 100K |
| Resistance **61** | | 82K |
| Resistance **63** | | 270K |
| Resistance **64** | | 1.5m |
| Resistance **67** | | 22K |
| Resistance **68** | | 3.9m |
| Resistance **69** | | 1.8m |
| Resistor **73** | | 1.5m |
| Resistor **74** | | 910K |
| Capacitor **55** | | 400μμf. |
| B+ | volts | +200 |
| B− | do | −200 |
| Terminal **75** | do | 416 |

Figure 5:
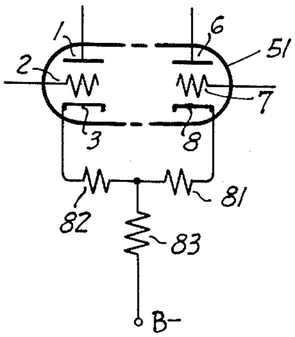
FIGURE 5 is a partial circuit diagram showing a modification of the circuitry shown in FIGURE 4.

In the foregoing embodiment of the D.C. amplifier 11, the pi type resistive network 66 was utilized. However, as will be readily apparent to those skilled in the art, a T section network can be substituted for the pi section network of the type as shown in FIGURE 5. As shown in FIGURE 5, a resistance 82 has one end connected to the cathode element 3 of tube 51 and has its other end connected to a resistor 81. The other end of resistor 81 is connected to the cathode element 8 of tube 51. The mid point between the resistors 81 and 82 is connected to one end of the resistor 83 and the other end of the resistor is connected to B−.

It is apparent from the foregoing that I have provided a new and improved operational amplifier in which optimum gain can be achieved without sacrifice in stability.

I claim:

1. In an operational amplifier for amplifying an input signal having high and low frequency components, a D.C. amplifier, a capacitive-resistive coupling connected to the D.C. amplifier for applying the relatively high frequency components of the input signal to the D.C. amplifier, and a chopper stabilized amplifier for applying the relatively low frequency components of the input signal to the D.C. amplifier, the D.C. amplifier comprising first and second tube sections each having plate, grid and cathode elements, means for applying plate voltage to the plate elements of each tube section, means for applying the relatively high frequency component to the grid element of the first tube section, means for applying the relatively low frequency components from the chopper stabilized amplifier to the grid element of the second tube section, impedance means connected to the plate element of the second tube section, means for deriving a regenerative feedback voltage from the plate voltage on the plate element of the second tube section and applying the same to the cathode element of the second tube section, impedance means interconnecting the cathode elements of the first and second tube sections, and additional impedance means connecting the cathode elements of the first and second tube sections to ground.

2. An operational amplifier as in claim 1 wherein said means for deriving a regenerative feedback voltage and applying the same to the cathode element of the second tube section includes a cathode follower having plate, grid and cathode elements, the grid element of the cathode follower being directly connected to the plate element of the second tube section and wherein a resistor connects the cathode element of the cathode follower to the cathode element of the second tube section.

3. In an operational amplifier for an input signal having high and low frequency components, a D.-C. amplifier, a capacitive-resistive coupling connected to the D.-C. amplifier for applying the relatively high frequency component of the input signal to the D.-C. amplifier, and a stabilizing amplifier for applying the low frequency components of the input signal to the D.-C. amplifier, the D.-C. amplifier comprising a pair of differential amplifiers, each of the differential amplifiers comprising first and second tube sections each having plate, grid and cathode elements, means for applying plate voltage to the plate elements of each tube section, means for connecting the relatively high frequency components of the input signal to the grid element of the first tube section, means for applying the output of the stabilizing amplifier to the grid element of the second tube section of the first stabilizing amplifier, impedance means connected to the plate element of the second tube section of the first and second differential amplifiers, means for applying the plate voltage from the plate element of the second tube section of the first differential amplifier directly to the grid element of the first section of the second differential amplifier, means for connecting the plate voltage of the first section of the first differential amplifier to the grid element of the second section of the second differential amplifier, impedance means connecting the cathode elements of the first and second sections of the first differential amplifier, impedance means for connecting the cathode elements of the first and second sections of the first differential amplifier to ground, means interconnecting the cathode elements of the first and second sections of the second differential amplifier, impedance means connecting the cathode elements of the first and second sections of the second differential amplifier to a negative voltage, and impedance means connecting the cathode element of the first section of the second differential amplifier to the cathode element of the second section of the first differential amplifier to apply a regenerative feedback voltage to the cathode element of the second section of the first differential amplifier.

4. An operational amplifier as in claim 3 together with impedance means connecting the grid element of the second section of the second differential amplifier to ground.

5. In a D.-C. amplifier for producing an amplified signal which is proportional to a pair of input signals, first and second tube sections each having plate, grid and cathode elements, means for applying positive plate voltage to the plate element of each tube section, means for applying one of the input signals to one of the grid elements and the other of the input signals to the other grid element, impedance means connected to the plate element of the second tube section, means for applying a regenerative feedback voltage derived from the voltage on the plate element of the second tube section to the cathode element of the second tube section, and impedance means interconnecting the cathode elements of the first and second tube sections and for connecting the same to a negative voltage.

6. A D.-C. amplifier as in claim 5 wherein said last named impedance means is a pi-type network.

7. A D.-C. amplifier as in claim 5 wherein said means for applying the regenerative feedback voltage derived from the voltage on the plate element of the second tube section to the cathode element of the second tube section includes a cathode follower having plate, grid and cathode elements, means for directly connecting the plate element of the second tube section to the grid element of the cathode follower, and resistance means for connecting the cathode element of the cathode follower to the cathode element of the second tube section.

8. In an operational amplifier for amplifying an input signal having high and low frequency components, a D.-C. amplifier, a capacitive-resistive coupling connected to the D.-C. amplifier for applying the relatively high frequency components of the input signal to the D.-C. amplifier, and a chopper stabilized amplifier for applying the relatively low frequency components of the input signal to the D.-C. amplifier, the D.-C. amplifier comprising first, second and third tubes each having plate, grid and cathode elements, means for applying the relatively high frequency components to the grid element of the first tube, means for applying the relatively low frequency components from the chopper stabilized amplifier to the grid element of the second tube, impedance means connecting the plate element of the second tube to the plate element of the third tube, means for applying the plate voltage from the plate element of the second tube to the grid element of the third tube, impedance means connecting the cathode element of the third tube to the cathode element of the second tube to apply a regenerative feedback voltage to the cathode element of the second tube, impedance means connecting the cathode element of the second tube to the cathode element of the first tube, and impedance means connecting the cathode elements of the first and second tubes to ground.

9. An operational amplifier as in claim 8 wherein said chopper stabilized amplifier includes a chopper modulator for converting the low frequency components into a square wave, an amplifier, a demodulator operating in synchronism with the chopper, capacitance means connecting the amplifier output to the demodulator, the demodulator consisting of a pair of serially connected diodes, and a source of voltage alternating with respect to ground applied to each diode, the voltages applied to the diodes being 180 degrees out of phase with each other, the amplifier output being connected to the demodulator point between the pair of serially connected diodes.

10. An operational amplifier as in claim 8 wherein said chopper stabilized amplifier includes a chopper modulator converting the low frequency components into a square wave, an amplifier, capacitance means connected to the input of the amplifier and to the output of the chopper modulator, a demodulator, capacitance means connecting the output of the amplifier to the demodulator, the demodulator operating in synchronism with the chopper modulator, the demodulator consisting of a pair of serially connected diodes, a pair of resistors connected in series with the pair of diodes to form a pair of branches with each branch consisting of a diode and a resistor in series, and a source of voltage alternating with respect to ground applied to each branch, the voltages applied to the branches being 180 degrees out of phase with each other, the output of the amplifier being connected to the demodulator at a point between the two branches.

11. In an operational amplifier for amplifying an input signal having high and low frequency components, a D.-C. amplifier, a capacitive-resistive coupling connected to the D.-C. amplifier for applying the relatively high frequency components of the input signal to the D.-C. amplifier, and a chopper stabilized amplifier for applying the relatively low frequency components of the input signal to the D.-C. amplifier, the D.-C. amplifier comprising first and second tube sections each having plate, grid and cathode elements, means for applying plate voltage to the plate elements of each tube section, means for applying the relatively high frequency components to the grid element of the first tube section, means for applying the relatively low frequency components from the chopper stabilized amplifier to the grid element of the second tube section, impedance means connected to the plate element of the second tube section, means for deriving a regenerative feedback voltage from the plate voltage on the plate element of the second tube section and applying the same to the cathode element of the second tube section, impedance means interconnecting the cathode elements of the first and second tube sections, and additional impedance means connecting the cathode elements of the first and second tube sections to ground, said chopper stabilized amplifier including a chopper modulator for converting the low frequency components into a squarewave, an amplifier coupled to the chopper modulator, a demodulator coupled to the output of the amplifier and operating in synchronism with the chopper modulator, the demodulator including a pair of serially connected diodes, and a source of voltage alternating with respect to ground applied to each diode, the voltages applied to the pair of diodes being 180° out of phase with each other, the amplifier output being coupled to the demodulator at a point between the pair of serially connected diodes.

References Cited in the file of this patent

UNITED STATES PATENTS

| | | |
|---|---|---|
| 2,256,085 | Goodale | Sept. 16, 1941 |
| 2,297,543 | Eberhardt et al. | Sept. 29, 1942 |
| 2,386,892 | Hadfield | Oct. 16, 1945 |
| 2,430,699 | Berkoff | Nov. 11, 1947 |
| 2,443,864 | MacAuley | June 22, 1948 |
| 2,581,456 | Swift | Jan. 8, 1952 |
| 2,677,729 | Mayne | May 4, 1954 |
| 2,709,205 | Colls | May 24, 1955 |
| 2,731,519 | Bordewieck | Jan. 17, 1956 |

FOREIGN PATENTS

| | | |
|---|---|---|
| 529,044 | Great Britain | Nov. 13, 1940 |

OTHER REFERENCES

Bradley et al.: Electronics, vol. 25, No. 4, April 1952, pages 144–148.